(12) United States Patent
Kamarehi et al.

(10) Patent No.: US 11,222,770 B2
(45) Date of Patent: *Jan. 11, 2022

(54) MICROWAVE APPLICATOR WITH SOLID-STATE GENERATOR POWER SOURCE

(71) Applicant: MKS Instruments, Inc., Andover, MA (US)

(72) Inventors: Mohammad Kamarehi, Lexington, MA (US); Ken Trenholm, Salem, NH (US); Colin Sanford, Atkinson, NH (US); Kevin Wenzel, Belmont, MA (US); Olivia Keller, Topsfield, MA (US)

(73) Assignee: MKS INSTRUMENTS, INC., Andover, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/993,775

(22) Filed: Aug. 14, 2020

(65) Prior Publication Data

US 2021/0005430 A1 Jan. 7, 2021

Related U.S. Application Data

(63) Continuation of application No. 15/460,611, filed on Mar. 16, 2017, now Pat. No. 10,790,118.

(51) Int. Cl.
*H01J 37/32* (2006.01)
*H05B 6/64* (2006.01)
(Continued)

(52) U.S. Cl.
CPC .. *H01J 37/32266* (2013.01); *H01J 37/32917* (2013.01); *H01L 21/67248* (2013.01);
(Continued)

(58) Field of Classification Search
CPC ...... H05B 6/6447; H05B 6/645; H05B 6/686; H05B 6/702; H05B 6/806;
(Continued)

(56) References Cited

U.S. PATENT DOCUMENTS 5,179,264 A 1/1993 Cuomo et al.
9,299,537 B2 3/2016 Kobayashi et al.
(Continued)

FOREIGN PATENT DOCUMENTS

EP 0459177 A2 * 12/1991 .......... H01J 37/3222
EP 0459177 A2 12/1991
(Continued)

OTHER PUBLICATIONS

Partial Search Report issued in corresponding International Application No. PCT/US18/13845, dated Jun. 18, 2018.

*Primary Examiner* — Amy Cohen Johnson
*Assistant Examiner* — Syed M Kaiser
(74) *Attorney, Agent, or Firm* — Burns & Levinson LLP; Steven M. Mills

(57) ABSTRACT

A microwave system has a solid-state generator which generates microwave energy and includes at least one control input for receiving a control signal to vary electrically a parameter of the microwave energy. A microwave load receives the microwave energy and produces an effect in response to the microwave energy. A microwave conducting element couples the microwave energy to the microwave load. An impedance match adjusting device is coupled to the microwave conducting element to vary at least one of the parameters of the microwave energy. The effect produced in response to the microwave energy is altered by both electrical variation of the parameter of the microwave energy via
(Continued)

the control signal and adjustment of the impedance match adjusting device to vary the parameter of the microwave energy.

10 Claims, 11 Drawing Sheets

(51) Int. Cl.
  *H05B 6/68* (2006.01)
  *H01L 21/67* (2006.01)
  *H05B 6/70* (2006.01)
  *H05B 6/80* (2006.01)
  *H01P 5/10* (2006.01)
  *H01P 1/20* (2006.01)

(52) U.S. Cl.
  CPC ........... *H05B 6/645* (2013.01); *H05B 6/6447* (2013.01); *H05B 6/686* (2013.01); *H05B 6/702* (2013.01); *H05B 6/806* (2013.01); *H01P 1/20* (2013.01); *H01P 5/10* (2013.01); *Y02B 40/00* (2013.01)

(58) Field of Classification Search
  CPC ........... H01J 37/32192; H01J 37/32917; H01J 37/3244; H01J 37/32266; H01J 2237/332; H01L 21/67248
  See application file for complete search history.

(56) References Cited

U.S. PATENT DOCUMENTS

| | | | |
|---|---|---|---|
| 9,520,273 B2 * | 12/2016 | Osada | H01J 37/32192 |
| 9,653,266 B2 * | 5/2017 | Chen | H01J 37/32201 |
| 9,860,941 B2 | 1/2018 | Grandemenge et al. | |
| 10,790,118 B2 * | 9/2020 | Kamarehi | H01J 37/32917 |
| 2003/0214651 A1 | 11/2003 | Hudak | |
| 2006/0051505 A1 * | 3/2006 | Kortshagen | C01G 1/00 427/212 |
| 2009/0065486 A1 * | 3/2009 | Yamashita | H01L 21/31662 219/121.58 |
| 2009/0267669 A1 * | 10/2009 | Kasai | H05B 6/686 327/164 |
| 2010/0194278 A1 | 8/2010 | Ouyang | |
| 2012/0228261 A1 * | 9/2012 | Watanabe | H01J 37/32357 216/41 |
| 2013/0329204 A1 * | 12/2013 | Pellemans | G03F 7/70483 355/67 |
| 2013/0335446 A1 * | 12/2013 | Piippo | G06F 3/04815 345/633 |
| 2014/0339677 A1 * | 11/2014 | Eden | H01L 29/66234 257/586 |
| 2015/0056107 A1 | 2/2015 | Hancock | |
| 2015/0129112 A1 * | 5/2015 | Saito | H01J 37/32532 156/89.12 |
| 2015/0318148 A1 | 11/2015 | Chen et al. | |
| 2016/0222516 A1 * | 8/2016 | Ikeda | H01J 37/3244 |
| 2016/0351404 A1 * | 12/2016 | Aramaki | H01J 37/32715 |
| 2017/0011890 A1 * | 1/2017 | Aramaki | C23C 16/4586 |
| 2017/0077877 A1 | 3/2017 | Anderson | |
| 2017/0125219 A1 | 5/2017 | Kobayashi et al. | |
| 2017/0133202 A1 * | 5/2017 | Berry, III | H01J 37/32238 |
| 2017/0239719 A1 * | 8/2017 | Buller | B23K 26/032 |
| 2017/0317654 A1 * | 11/2017 | Velazco | H03F 3/20 |

FOREIGN PATENT DOCUMENTS

| | | |
|---|---|---|
| TW | 201206254 A1 | 2/2012 |
| TW | 201423827 A | 6/2014 |
| WO | 2009060213 A1 | 5/2009 |

* cited by examiner

MICROWAVE APPLICATOR WITH SOLID-STATE GENERATOR POWER SOURCE

RELATED APPLICATIONS

This application is a Continuation of U.S. application Ser. No. 15/460,611 filed on Mar. 16, 2017, entitled "MICROWAVE APPLICATOR WITH SOLID-STATE GENERATOR POWER SOURCE", the entire contents of which are incorporated herein by reference.

BACKGROUND

1. Technical Field

The present disclosure is related to microwave applicators and, in particular, to a microwave applicator which utilizes a solid-state generator as its microwave energy source.

2. Discussion of Related Art

In semiconductor processing, plasma generators are often employed upstream of a processing chamber. In plasma generators, energy is typically coupled to a gas flowing through a plasma discharge tube which is located in a microwave cavity, and plasma is excited in the gas by the microwave energy. Plasma products flow downstream through the plasma discharge tube, into the process chamber, and impinge on a workpiece such as a semiconductor wafer.

Microwave energy is very useful for materials processing, heating and generating plasmas for multiple applications. In semiconductor and other plasma processing applications, intense microwave discharges are important in many applications such as deposition, etching, cleaning, ashing, and ion beam generation. Many commercial systems are amenable to microwave processing. However, most existing microwave processing technology is limited in that it relies on vacuum tube technology for the generation of the microwave energy. As a result, limitations are imposed on the processes. Further, most plasma and material processing supplies are based on commercial home oven and industrial type magnetrons operating at 2.45 GHz and are therefore limited in the applications in which they can be used, due to the inherent limitations of tube technology.

Microwave material processing is becoming increasingly important as a manufacturing processing technique. These processes include heating, curing, sintering, annealing or, in general, any process that directly couples microwave energy into a solid, liquid or gaseous material to change the chemical or physical structure of that material.

Microwave processing systems are commercially available. These systems have significant disadvantages that limit their use in some applications because of their use of oven magnetrons. Although some of these systems use resonant applicators or slotted waveguides, most of these systems are multi-mode microwave ovens. In these systems, for regions of low electromagnetic field, curing is slower than in regions of high electromagnetic fields. Another important drawback of prior tube-type microwave systems is a lack of process control. In the typical oven-type system, it is very difficult to determine when a process is completed and to correct for problems in the process, such as over-heating.

The vast majority of commercially available microwave tubes are oscillators which operate at fixed frequency. There is no effective electrical means for controlling the frequency of these microwave tubes in real time.

SUMMARY

According to one aspect, a microwave system having a solid-state generator is provided. The solid-state generator generates microwave energy characterized by one or more parameters, and includes at least one control input for receiving a control signal to vary electrically the one or more parameters of the microwave energy. A microwave load receives the microwave energy and produces an effect in response to the microwave energy. A microwave conducting element couples the microwave energy to the microwave load. An impedance match adjusting device is coupled to the microwave conducting element to vary at least one of the one or more parameters of the microwave energy. A controller generates the control signal to vary one or more parameters of the microwave energy. The effect produced in response to the microwave energy is altered by both electrical variation of the one or more parameters of the microwave energy via the control signal and adjustment of the impedance match adjusting device to vary the at least one of the one or more parameters of the microwave energy.

In some exemplary embodiments, the microwave conducting element comprises a waveguide. In some exemplary embodiments, the impedance match adjusting device comprises a mechanical stub tuner. In some exemplary embodiments, the microwave stub tuner comprises multiple stubs. In some exemplary embodiments, the system further comprises a coax-to-waveguide transition for coupling the solid-state generator to the waveguide.

In some exemplary embodiments, the control input is an electrical control input for receiving the control signal to vary electrically the one or more parameters of the microwave energy.

In some exemplary embodiments, the microwave load comprises a chamber. In some exemplary embodiments, the chamber is used in processing a semiconductor substrate. In some exemplary embodiments, the microwave load comprises a chamber in which heat is controlled, the heat in the chamber being the effect produced in response to the microwave energy. In some exemplary embodiments, the chamber is used in processing a semiconductor substrate.

In some exemplary embodiments, the microwave load comprises a plasma applicator, such that the microwave energy is used to generate plasma, the plasma being the effect produced in response to the microwave energy.

In some exemplary embodiments, the system further comprises a second solid-state generator for generating microwave energy, the microwave energy of the first solid-state generator having a first frequency and the microwave energy of the second solid-state generator having a second frequency. In some exemplary embodiments, the first and second frequencies of the first and second solid-state generators are different. In some exemplary embodiments, one of the first and second frequencies is approximately 915 MHz, and another of the first and second frequencies is approximately 2,450 MHz. In some exemplary embodiments, the system further comprises a coax-to-waveguide transition for coupling the first and second solid-state generators to the microwave conducting element.

In some exemplary embodiments, the system further comprises a second solid-state generator for generating microwave energy, the microwave energy of the first solid-state generator having a first phase and the microwave energy of the second solid-state generator having a second phase. In some exemplary embodiments, the first and second phases of the first and second solid-state generators are different and are adjustable relative to each other.

In some exemplary embodiments, the solid-state generator comprises a plurality of frequency synthesizers with independently controllable frequency and/or phase, outputs of the plurality of frequency synthesizers being used to generate the microwave energy.

In some exemplary embodiments, the solid-state generator comprises a plurality of amplifiers with independently controllable frequency and/or phase, outputs of the plurality of amplifiers being used to generate the microwave energy.

According to another aspect, a microwave plasma system is provided. The microwave plasma system includes a solid-state generator for providing microwave energy characterized by one or more parameters, the solid-state generator having at least one electrical control input for receiving a control signal to vary electrically the one or more parameters of the microwave energy. A plasma applicator receives the microwave energy, the plasma applicator comprising a plasma discharge tube in which a plasma is generated in response to the microwave energy, a central longitudinal axis of the plasma discharge tube extending between opposite ends of the plasma discharge tube, the plasma generated in the plasma discharge tube being characterized by a spatial plasma intensity profile distributed longitudinally along the central longitudinal axis and radially from the central longitudinal axis, perpendicular to the central longitudinal axis, toward a radial wall of the plasma discharge tube. A detector receives a first signal from the plasma discharge tube and converts the first signal to an electrical signal indicative of the spatial plasma intensity profile in the plasma discharge tube. A controller receives the electrical signal indicative of the spatial plasma intensity profile in the plasma discharge tube, generates from the electrical signal the control signal to vary electrically the one or more parameters of the microwave energy, and applies the control signal to the control input of the solid-state generator to vary electrically the one or more parameters of the microwave energy to alter the spatial plasma intensity profile in the plasma discharge tube.

In some exemplary embodiments, the detector is an optical detector, and the first signal is an optical signal. In some exemplary embodiments, the optical detector comprises a camera.

In some exemplary embodiments, the detector is a temperature detector, and the first signal is a thermal signal. In some exemplary embodiments, the temperature detector comprises a thermocouple.

In some exemplary embodiments, the system further comprises a waveguide for coupling the microwave energy to the plasma discharge tube; and a mechanical tuner coupled to the waveguide to vary mechanically at least one of the one or more parameters of the microwave energy.

In some exemplary embodiments, the mechanical tuner comprises a microwave stub tuner. In some exemplary embodiments, the microwave stub tuner comprises multiple stubs.

In some exemplary embodiments, the mechanical tuner is a fixed tuner. In some exemplary embodiments, the mechanical tuner is a motorized binary tuner.

In some exemplary embodiments, the optical detector comprises a camera or other light-sensitive device.

In some exemplary embodiments, the one or more parameters of the microwave energy comprise frequency of the microwave energy. In some exemplary embodiments, the one or more parameters of the microwave energy comprise phase of the microwave energy.

In some exemplary embodiments, the solid-state generator comprises a plurality of frequency synthesizers with independently controllable frequency and/or phase, outputs of the plurality of frequency synthesizers being used to generate the microwave energy.

In some exemplary embodiments, the solid-state generator comprises a plurality of amplifiers with independently controllable frequency and/or phase, outputs of the plurality of amplifiers being used to generate the microwave energy.

BRIEF DESCRIPTION OF THE DRAWINGS

The present disclosure is further described in the detailed description which follows, in reference to the noted plurality of drawings by way of non-limiting examples of embodiments of the present disclosure, in which like reference numerals represent similar parts throughout the several views of the drawings.

DETAILED DESCRIPTION OF PREFERRED EMBODIMENTS

Microwave sources are typically of one of two types, namely, solid-state-type sources and vacuum-tube-type sources. There are many types of tube-type sources, including magnetrons, klystrons, gyrotrons, traveling wave tubes, and the like. Tubes are typically capable of operating at higher frequencies and power levels than solid-state sources. The main disadvantage of tube-type sources is that they are large, bulky, heavy and very expensive, and they require high voltage from the anode to the cathode and high current for a filament, and require a vacuum envelope in which to operate. Tubes are also difficult to control and have short lifetimes, mainly due to depletion of the cathode thermionic emission or vacuum leaks.

The use of solid-state microwave generators as excitation sources for material and plasma processes provides significant advantages over tube-type generators such as magnetrons. For example, solid-state microwave generators can be controlled at low current, voltage, power and phase. These features are not present in vacuum tube microwave processes and, therefore, are unavailable to processes in which control is important. Also, solid-state microwave power sources are much more economical in terms of cost of ownership and space requirements. They also can readily be used in arrays and have the phase and amplitude control that permit adjustment to obtain desired field intensities throughout reaction chambers.

According to the exemplary embodiments, solid-state generators are used as the source of microwave power or radiation for plasma or material processing. The frequency, phase and power level of these generators can be adjusted to optimize the processing being carried out. These solid-state devices may be comprised of bipolar or field-effect transistors, e.g., metal-oxide-semiconductor field-effect transistors (MOSFETs) or laterally diffused metal-oxide-semiconductor (LDMOS) devices, in which methods of power, current, voltage and phase control can be used.

According to some exemplary embodiments, in plasma processing, a plasma applicator can include elements in which the amplitude, power and/or phase is controllable, such that the spatial distribution of microwave energy can be controlled.

Figure 1:
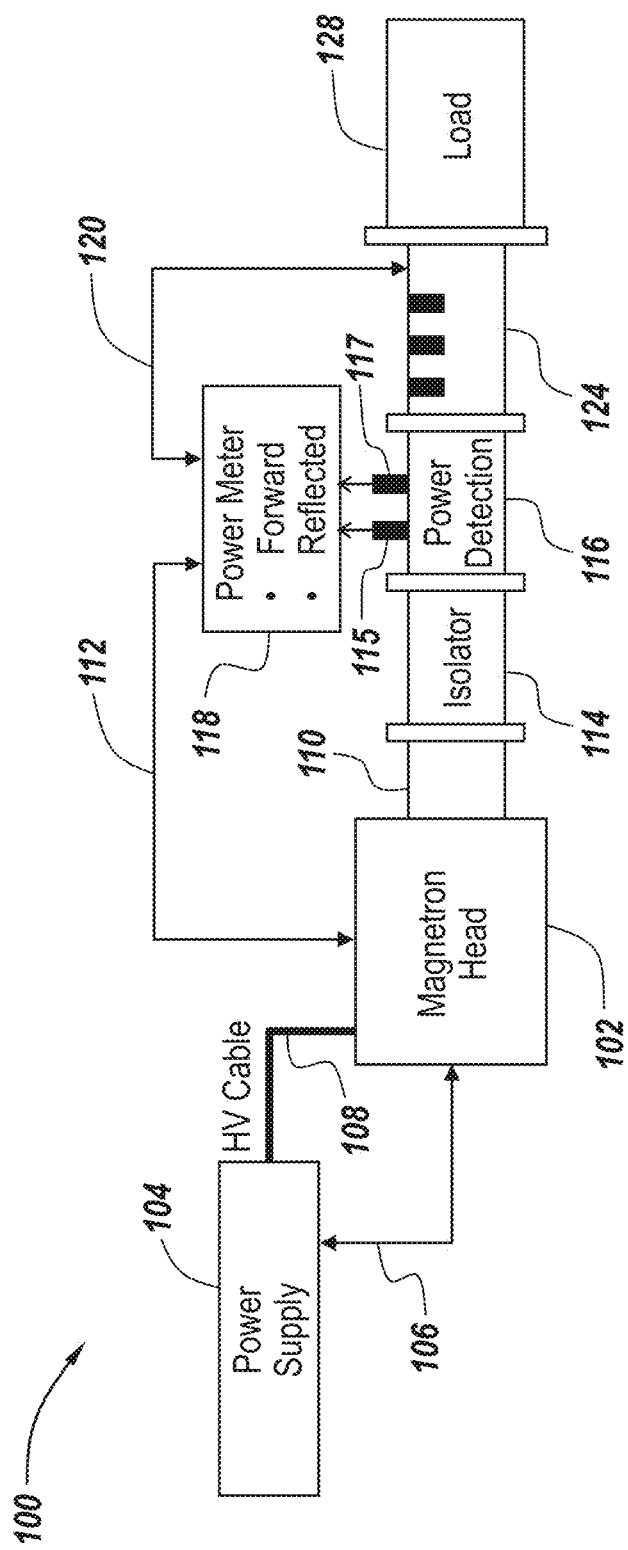
FIG. 1 includes a schematic functional block diagram of a microwave system, using a magnetron as a microwave energy source, according to the prior art.

FIG. 1 includes a schematic functional block diagram of a microwave system 100, using a magnetron as a microwave energy source, according to the prior art. Referring to FIG. 1, system 100 includes a magnetron head 102, which provides the microwave energy. Magnetron head 102 includes the magnetron, a filament transformer and control electronics. Magnetrons typically include some form of anode and cathode operated in a DC magnetic field normal to a DC electric field between the cathode and anode. The anode is a single-frequency tuned reentrant cavity. The electrons emitted via thermal emission from the typically thoriated tungsten cathode are influenced by the crossed field between the cathode and anode to move in curved paths. If the DC magnetic field is strong enough, the electrons will not arrive at the anode, but instead will return to the cathode. However, prior to returning to the cathode, the electrons will lose and exchange their energy to the weak electromagnetic field created by the anode generating high-energy microwaves at the frequency set by the anode. Historically, two frequencies, namely, 915 and 2,450 MHz, have been designated for industrial applications. Recently, attention has also been given to a much higher frequency of 5,800 MHz.

Continuing to refer to FIG. 1, a DC power supply 104 provides a high DC voltage to the magnetron head 102 via a high-voltage cable 108. Appropriate power sense and control signals between power supply 104 and magnetron head 102 are transferred over control signal lines 106. The microwave output energy is coupled out of magnetron head 102 via waveguide 110. An isolator 114 protects the magnetron head 102 from reflected energy which can be caused by load mismatch. A power detection module 116 receives the microwave energy from isolator 114. Power detection module 116 interfaces with magnetron head 102 for power control and measurements via control lines 112. Power detection module 116 includes a pair of outputs 115 and 117 for coupling the microwave energy to power meter 118. The forward energy can be coupled via output 115 to power meter 118, and reflected energy can be coupled to power meter 118 via output 117, such that power meter 118 detects both forward and reflected microwave power via power detection module 116.

An impedance match adjusting device such as mechanical tuning module 124 receives the microwave energy. In exemplary embodiments, mechanical tuning module 124 can be a stub tuner, which is controlled in one of multiple possible fashions. For example, as illustrated, stub tuner 124 can be manually tuned, tuned in a motorized fashion or auto tuned. In manual tuning, an operator manually inserts stubs to minimize the amount of reflected power from a source of power measurements, as illustrated schematically by stub tuner 124. In motorized tuning, an operator adjusts the tuner via a remote electromechanical device to tune for the lower reflected power, via a control signal on line 120 to motorized tuner 124. In auto tuning, no operator is involved, since the system automatically tunes for the lowest reflected power via power detector 116, which can provide information that can be used to calculate the impedance of the load and the amount of forward/reflected power. Auto tuning control is provided by a control signal on line 120 to auto tuner 124. Binary tuning of mechanical tuning module 124 can also be performed.

In some exemplary embodiments, the tuning can be performed by either reducing the ratio of reflected power to forward power or by calculating the load impedance and reducing the voltage standing wave ratio (VSWR) to less than approximately 1.2, for example. In some exemplary embodiments, reducing the VSWR can include calculating the reflection coefficient of the load, and using the S-parameters (scattering matrix) to minimize the VSWR, which is essentially reducing the reflection coefficient, which is related to the ratio of reflected power to forward power. S-parameters used to reduce VSWR can include forward power and reflected power elements, which in turn are used to minimize the reflection coefficient. Mechanical tuning module 124 also interfaces with precision power detection module 116 for control and communication via a control interface cable 120. A load 128 can be connected following mechanical tuning module 124. Load 128 can be a plasma applicator, in which the microwave energy is used as plasma-generating excitation. Load 128 can also be an industrial heating material, which also possesses dynamic load impedance versus temperature.

There are several disadvantages associated with the use of magnetron-based technology for generation of microwave energy and related applications. A magnetron is a fixed-frequency device. Its single frequency is dictated and tuned by the anode reentrant structure and it typically falls within the industrial, scientific and medical (ISM) band of 2,400-2,500 MHz. Magnetron manufacturers typically try to design and fabricate the anode such that the frequency is set at 2,450 MHz. However, due to mechanical tolerances, the frequency deviates from 2,450 MHz so the center frequency is different from magnetron to magnetron, which can lead to difficulties in matching the load impedance. Due to depletion of the cathode's thoriated tungsten, the life expectancy of magnetrons is typically limited to about 6,000 hours of operation. The efficiency of the magnetron diminishes over time, leading to reduction in power. The delivery system is typically bulky and includes many components.

Recently, solid-state technology for 2,450 MHz applications has become more prevalent. With the advent and development of LDMOS and GaN transistors for higher powers at 2,450 MHz it has become more practical to develop high-power solid-state generators.

Solid-state technology provides many features and benefits over the traditional microwave technology. One important advantage is the automatic frequency tuning within the ISM frequency band of 2,400-2,500 MHz. Automatic frequency tuning replaces or reduces the demand for the mechanical tuning used with conventional magnetron-based delivery systems. Solid-state technology also provides faster tuning capability. Additional benefits include smaller footprint, lower operating cost and increased MTBF. The lower operating cost is due at least in part to the much longer life of solid-state technology, at least three times that of industrial magnetrons.

Because of the tuning improvements, solid-state technology can also provide enhanced impedance matching for a wide array of resonant plasma or non-plasma cavity modes, in which the operating frequency of the system should be equal to that of the resonant frequency of the cavity. This provides a full delivery of power to the load and therefore improves the tuning efficiency of the system as well as the efficiency of the power delivery.

Figure 2:
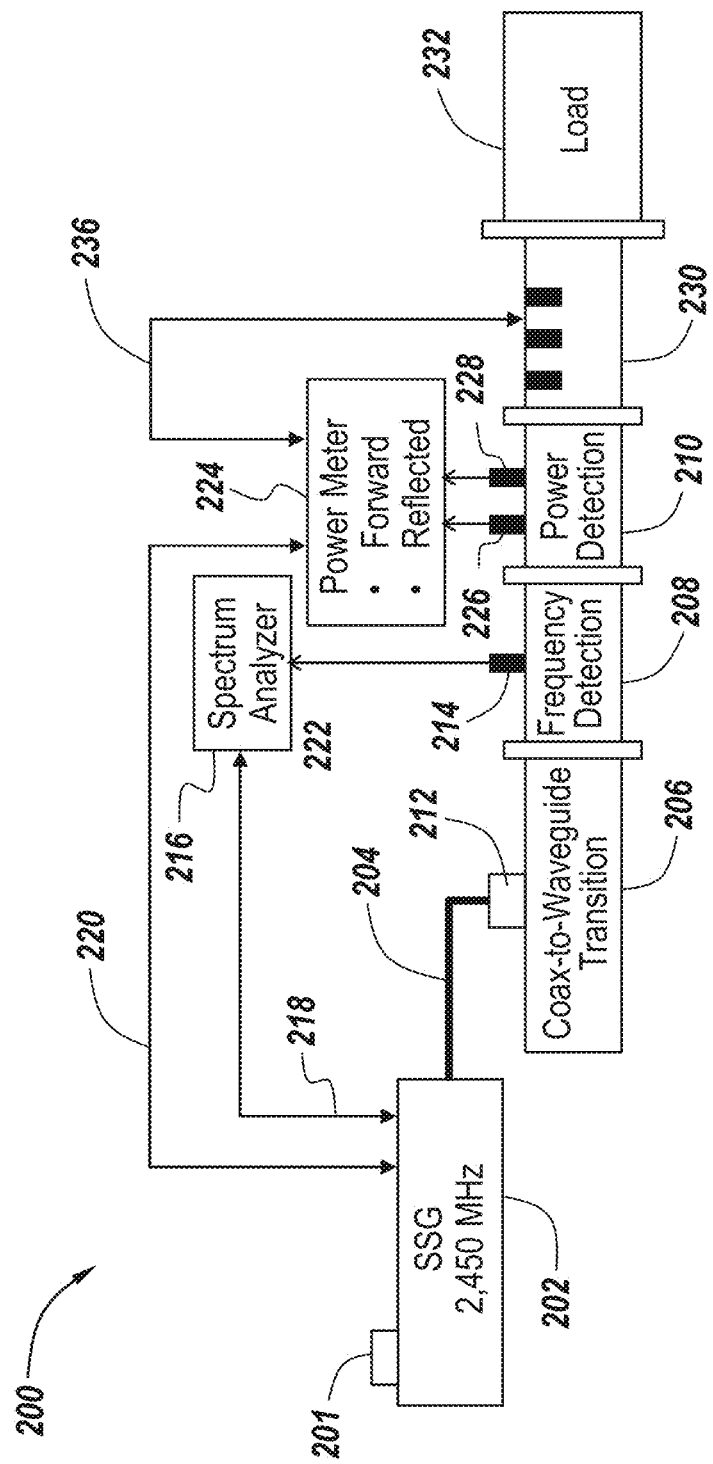
FIG. 2 includes a schematic functional block diagram of a microwave system, according to exemplary embodiments.

FIG. 2 includes a schematic functional block diagram of a microwave system 200, according to exemplary embodiments. Referring to FIG. 2, system 200 of the exemplary embodiments includes both conventional mechanical tuning and a tunable solid-state generator 202 to drive a load 232. Load 232 can be a plasma applicator or industrial heating material or other such system. In the exemplary embodiment illustrated in FIG. 2, solid-state generator 202 runs at an ISM frequency centered at 2,450 MHz. It will be noted that this frequency is selected merely for purposes of exemplary illustration and that other frequencies, such as, for example, 915 MHz, or other frequencies, can be used.

As illustrated in FIG. 2, solid-state generator 202 is connected to a coax-to-waveguide transition 206 at coaxial connector 212, via coaxial cable 204. Solid-state generator 202 includes one or more control inputs 201 for providing a control signal, such as by a user/operator, to make adjustments to one or more parameters of the output signal from solid-state generator 202, the parameters including one or more of frequency, phase and power level of the output signal. It is noted that the phase adjustment would be made to adjust phase with respect to another solid-state generator being used according to exemplary embodiments, as described below in detail. It is also noted that the phase and frequency of discrete RF amplifiers in one or more of the solid-state generators may also be adjusted relative to each other. It is also noted that control input 201 is used to represent schematically an optional manual adjustment provided by a user/operator. It will be understood that any control inputs provided to solid-state generator 202 can be provided by an analog signal or digital signal applied to an electrical input, such as on one or more of lines 218, 220, or other electrical connections.

Coax-to-waveguide transition 206 is used to transit the microwave energy from a dispersive coaxial mode to a microwave waveguide, which could be adapted to other waveguide components being used in system 200. The transition is achieved via an electric field probe inside the waveguide in the vicinity of the waveguide back wall. In some exemplary embodiments, coax-to-waveguide transition 206 is connected to frequency detection device 208, where the operating frequency of system 200 can be detected via either a single port 214 or multiple ports. Port 214 of frequency detection device 208 is connected to a spectrum analyzer 216 via line or cable 222 to detect the operating frequency. Spectrum analyzer 216 is also connected to solid-state generator 202 via cable 218. Spectrum analyzer 216 is used to check the frequency of solid-state generator 202 for bench testing. In exemplary embodiments of system 200, frequency settings can be confirmed via solid-state generator 202. In exemplary embodiments, spectrum analyzer 216 has a small footprint and is integrated in system 200, rather than implemented as a stand-alone device.

A power detector 210 follows frequency detection device 208. Power detector 210 allows for detection and measurement of both forward power from solid-state generator 202 via cable 220 and reflected power from load 232. This connection provides a control signal as part of a control loop to adjust operating power based on the power detected via power detection module 210. The forward and reflected power are detected via ports 226 and 228, respectively, which in some exemplary embodiments include crystal detectors for converting the high-frequency energy to a usable DC voltage signal. The DC signal is then fed into a power meter 224, which measures the actual magnitude of the power signals by internal computations within the power meter 224. The computations can be performed based on prior calibrations and taking into account the coupling factor of the waveguide power detection for both the forward and reflected power. In some exemplary embodiments, the power detection is implemented using, for example, a precision power detector (PDD), of the type manufactured and sold by MKS Instruments, Inc., the assignee of the present application, or other similar device.

An impedance match adjusting device such as triple stub tuner 230 is attached to power detector 210. Triple stub tuner 230 can be tuned manually, can include motorized tuning and/or binary tuning, and/or can be auto-tuned. Impedance match adjusting device 230 is connected via a signal cable 236 to power meter 224 and power detection module 210 for power detection and for reducing the reflected power by matching the load impedance. In manual tuning, an operator manually inserts stubs in stub tuner 230 to minimize the amount of reflected power from a source of power measurements. In auto tuning, there is no operator involved, since the stubs are adjusted automatically. In motorized tuning, the operator uses a remote electromechanical device to reduce the reflected power. In the binary tuning mode, the tuners are adjusted to only two preset positions, i.e., for ignition and operation. The manual option can be used to minimize the reflected power during the factory final test and is then held in position via a locking mechanical feature. In some exemplary embodiments, the reflected power is monitored by power meter 224, and, in response to the monitored reflected power, the user/operator adjusts the stub tuners to minimize the reflected power. An option can also be provided in the field in the deployed system 200 to allow for user adjustment, depending on the various process chemistries required by the user. The motorized feature can be used to allow adjustment of impedance match adjusting device 230 from a remote position. The result is the same as that for manual tuning, except that motorized tuning allows for the convenience of tuning from a remote location. Auto tuning is performed free of any interaction with the user. Using auto tuning, impedance match adjusting device 230 is automatically adjusted by detecting the forward and reflected power via power detection device 208. Cable 236 provides the interface between impedance match adjusting device 230 and power meter 224 for the adjustment of impedance match adjusting device 230 based on detection of forward and reflected power.

Figure 3:
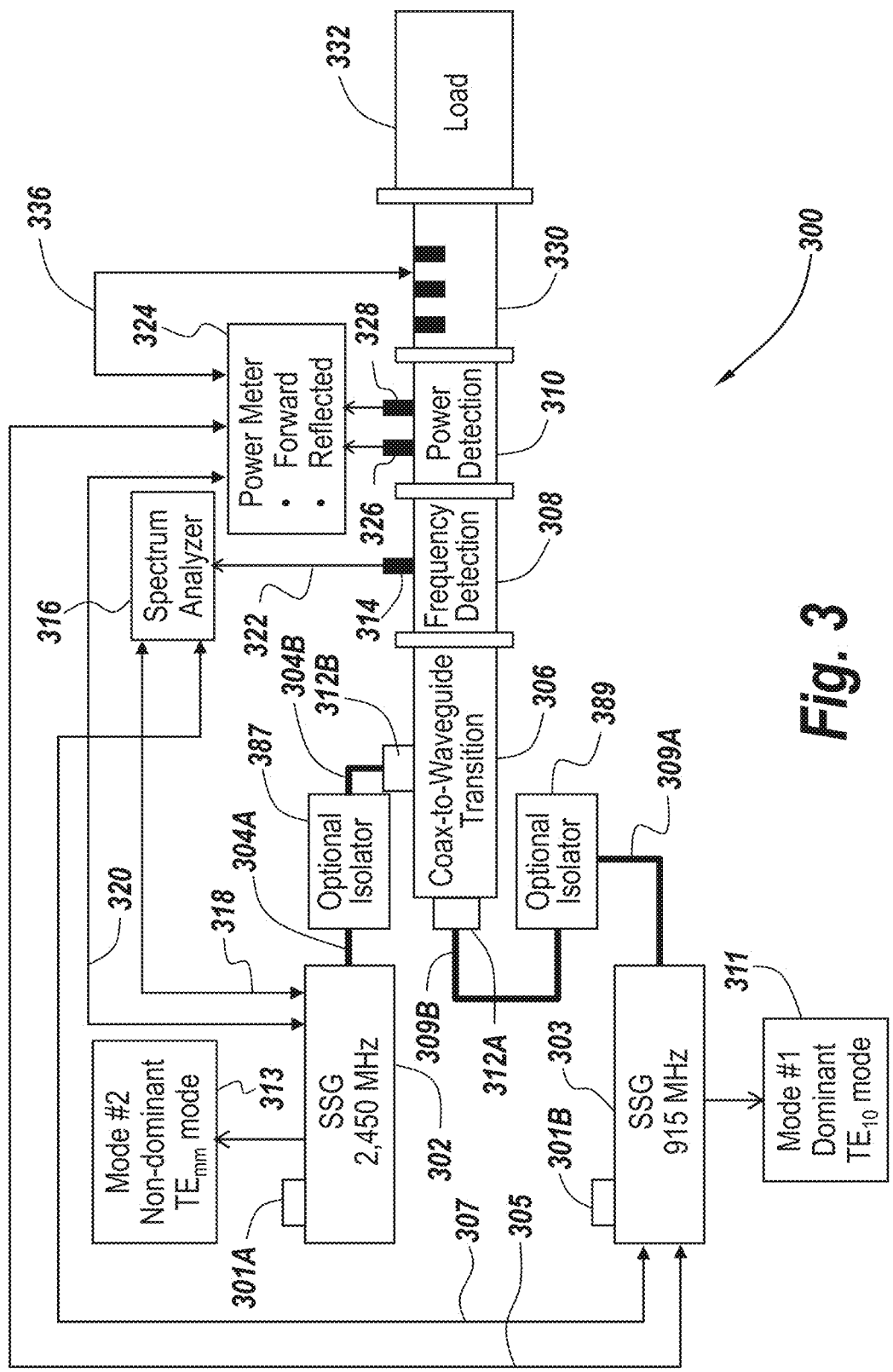
FIG. 3 includes a schematic functional block diagram of a microwave system, according to exemplary embodiments.

FIG. 3 includes a schematic functional block diagram of a microwave system 300, according to exemplary embodiments. Referring to FIG. 3, system 300 is similar to system 200 of FIG. 2 and includes several of the same features. The main difference between system 200 of FIG. 2 and system 300 of FIG. 3 is that system 300 of FIG. 3 operates at two different frequencies. In one specific exemplary embodiment, system 300 operates at frequencies of 2,450 MHz and 915 MHz. In some particular exemplary embodiments, this is accomplished by the use of two solid-state generators 302 and 303. In some exemplary embodiments, such as that illustrated in FIG. 3, solid-state generators 302 and 303 are separate, individual devices. In other exemplary embodiments, solid-state generators 302 and 303 are implemented in a single integrated device. Solid-state generators 302 and 303 include one or more control inputs 301A and 301B, respectively, for providing a control signal, such as by a user/operator, to make adjustments to one or more parameters of the output signals from solid-state generators 302 and 303, the parameters including one or more of frequency, phase and power level of the output signals. It is noted that the phase adjustment would be made to adjust phase of one of solid-state generators, e.g., 302, with respect to the other solid-state generator, e.g., 303, according to exemplary embodiments. It is also noted that control inputs 301A and 301B are used to represent schematically optional manual adjustments provided by a user/operator. It will be understood that any control inputs provided to solid-state generators 302 and 303 can be provided by an analog signal or digital signal applied to an electrical input, such as on one or more of lines 318, 320, or 305, 307, or other electrical connections.

Referring to FIG. 3, system 300 of the exemplary embodiments includes both conventional mechanical tuning and tunable solid-state generators 302 and 303 to drive a load 332. Load 332 can be a plasma applicator or industrial heating material or other such system. In the exemplary embodiment illustrated in FIG. 3, solid-state generators 302 and 303 run at ISM frequencies centered at 2,450 MHz and 915 MHz, respectively. It will be noted that these frequencies are selected merely for purposes of exemplary illustration and that other frequencies can be used. In general, the frequencies of the solid-state generators can be different and can be individually adjustable relative to each other.

As illustrated in FIG. 3, solid-state generator 302 is connected to a coax-to-waveguide transition 306 at coaxial connector 312B, via coaxial cables 304A and 304B, via an optional isolator 387. Similarly, solid-state generator 303 is connected to coax-to-waveguide transition 306 at coaxial connector 312A, via coaxial cables 309A and 309B, via an optional isolator 389. Isolators 387 and 389 isolate solid-state generators 302 and 303 from unwanted reflected power. Coax-to-waveguide transition 306 is used to transmit the microwave energy from a dispersive coaxial mode to a microwave waveguide, which could be adapted to other waveguide components being used in system 300. The transition is achieved via an electric field probe inside the waveguide in the vicinity of the waveguide back wall. In some exemplary embodiments, coax-to-waveguide transition 306 is a dominant $TE_{10}$-mode designed for 915 MHz frequency operation. The dominant $TE_{10}$ mode is the lowest-order propagating mode supported in a rectangular waveguide. Operating in this mode prevents higher-order modes from being excited and, therefore, brings performance stability to the microwave transmission and propagation. Coax-to-waveguide transition 306 could support either a dominant $TE_{10}$ mode operating at 2,450 MHz or a non-dominant mode of $TE_{mn}$ order. The non-dominant mode for the 2,450 MHz can be used since the waveguide dimensions designed for the dominant 915 MHz frequency is much larger in cross-section to support a dominant $TE_{10}$ mode at 2,450 MHz, since, the higher the frequency, the larger the waveguide cross-sectional dimensions. It is noted that, if coax-to-waveguide transition 306 is designed for a dominant $TE_{10}$ mode at 2,450 MHz operating frequency, the waveguide will not be able to support and propagate microwave energy in the waveguide due to its much lower operating frequency.

In some exemplary embodiments, coax-to-waveguide transition 306 is connected to frequency detection device 308, where the operating frequency of system 300 can be detected via either a single port 314 or multiple ports. Port 314 of frequency detection device 308 is connected to a spectrum analyzer 316 via line or cable 322 to detect the operating frequency. Spectrum analyzer 316 is also connected to solid-state generator 302 via cable 318. Spectrum analyzer 316 is used to check the frequency of solid-state generator 302 and 303 for bench testing. In exemplary embodiments of system 300, frequency settings can be confirmed via solid-state generators 302 and 303.

A power detector 310 follows frequency detection device 308. Power detector 310 allows for detection and measurement of both forward power from solid-state generators 302 and 303 via cables 320 and 305, respectively, and reflected power from load 332. These connections provide control signals as part of a control loop to adjust operating power based on the power detected via power detection module 310. The forward and reflected power are detected via ports 326 and 328, respectively, which in some exemplary embodiments include crystal detectors for converting the high-frequency energy to a usable DC voltage signal. The DC signal is then fed into a power meter 324, which measures the actual magnitude of the power signals by internal computations within power meter 324. The computations can be performed based on prior calibrations and taking into account the coupling factor of the waveguide power detection for both the forward and reflected power. In some exemplary embodiments, the power detection is implemented using, for example, a precision power detector (PDD), of the type manufactured and sold by MKS Instruments, Inc., the assignee of the present application, or other similar device.

An impedance match adjusting device such as triple stub tuner 330 is attached to power detector 310. Triple stub tuner 330 can be tuned manually, can include motorized and/or binary tuning, and/or can be auto-tuned. Impedance match adjusting device 330 is connected via a signal cable 336 to power meter 324 and power detection module 310 for power detection and for reducing the reflected power by matching the load impedance. In manual tuning, an operator manually inserts stubs in stub tuner 330 to minimize the amount of reflected power from a source of power measurements, as illustrated schematically by stub tuner 124. In auto tuning, there is no operator involved, since the stubs are adjusted automatically. In motorized tuning, the operator uses a remote electromechanical device to reduce the reflected power. In the binary tuning mode, the tuners are adjusted to only two preset positions, i.e., for ignition and operation. The manual option can be used to minimize the reflected power during the factory final test and is then held in position via a locking mechanical feature. The reflected power is monitored via power meter 324, and the user/operator adjusts the stub tuners to minimize the reflected power. An option can also be provided in the field in the deployed system 300 to allow for user adjustment, depending on the various process chemistries required by the user. The motorized feature can be used to allow adjustment of impedance match adjusting device 330 from a remote position. The result is the same as that for manual tuning, except that motorized tuning allows for the convenience of tuning from a remote location. Auto tuning is performed free of any interaction with the user. Using auto tuning, impedance match adjusting device 330 is automatically adjusted by detecting the forward and reflected power via power detection device 308 or the MKS Instruments PPD to minimize the ratio of reflected power to forward power. Cable 336 provides the interface between impedance match adjusting device 330 and power meter 324 for the adjustment of impedance match adjusting device 330 based on detection of forward and reflected power.

As described above, cable 318 interfaces spectrum analyzer module 316 with the 2,450 MHz solid-state generator 302, and cable 320 interfaces power meter 324 with the 2,450 MHz solid-state generator 302. Similarly, cable 307 interfaces spectrum analyzer module 316 with the 915 MHz solid-state generator 303, and cable 305 interfaces power meter 324 with the 915 MHz solid-state generator 303.

The benefits of the technology described herein either as a single-frequency (FIG. 2) or dual-frequency (FIG. 3) configuration include a faster impedance matching of a plasma applicator for higher throughput and tool efficiency and tool-to-tool repeatability to produce repeatable product at wafer level. It also provides impedance matching for a much wider range of load impedances which may include different gas chemistries, flows and process pressures. Different gas chemistries or processing materials have different load impedances and may require microwave energies of different frequencies to be able to tune and absorb the energy most efficiently. According to the exemplary embodiments, by using either a single solid-state generator or dual solid-state generators, a wide range of frequencies within the allowable ISM band can be provided to satisfy the frequency requirements in either semiconductor gas processing or material processing.

Figure 4:
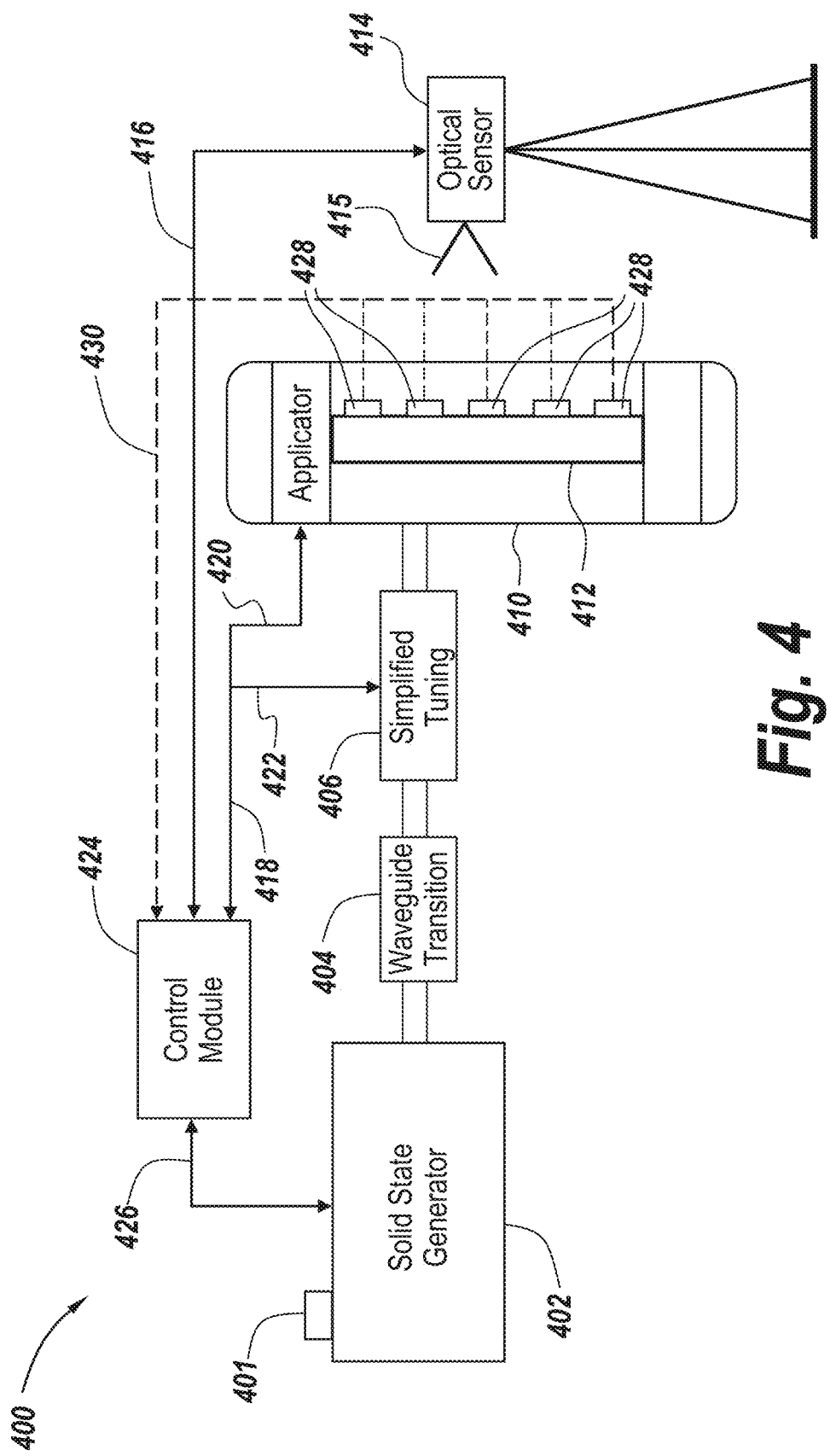
FIG. 4 includes a schematic functional block diagram of a plasma generation system using a solid-state generator as a plasma excitation power source, according to exemplary embodiments.

FIG. 4 includes a schematic functional block diagram of a plasma generation system using a solid-state generator as a plasma excitation power source, according to exemplary embodiments. In system 400, the microwave load (232 and 332 of systems 200 and 300 described in detail above) includes a plasma applicator 410, having a plasma discharge tube 412, in which a plasma is generated in response to microwave excitation energy. Referring to FIG. 4, plasma generation system 400 detects "hot spots," which are regions of high plasma intensity, and adjusts parameters of the microwave excitation energy to alter position and/or shape of the hot spots. The result is that erosion of plasma discharge tube 412 by the hot spots is distributed over a larger region of tube 412, such that the overall lifespan expectancy of tube 412 is extended substantially.

Referring to FIG. 4, plasma generation system 400 includes a solid-state generator 402, which generates microwave plasma excitation energy. Solid-state generator 402 includes one or more control inputs 401 for providing a control signal, such as by a user/operator, to make adjustments to one or more parameters of the output signal from solid-state generator 402, the parameters including one or more of frequency, phase and power level of the output signals. It is noted that the phase adjustment would be made to adjust phase of one of solid-state generators, e.g., 402, with respect to another solid-state generator, in the case in which multiple solid-state generators are being used. It is also noted that control input 401 is used to represent schematically optional manual adjustments provided by a user/operator. It will be understood that any control inputs provided to solid-state generator 402 can be provided by an analog signal or digital signal applied to an electrical input, such as on line 426, or other electrical connections.

Continuing to refer to FIG. 4, the microwave energy is coupled out of solid-state generator 402 to waveguide transition 404 connected to solid-state generator 402. Waveguide transition 404 is connected to simplified mechanical tuning module 406, i.e., impedance match adjusting device, which, as described above in connection with systems 200 and 300, provides mechanical tuning of the microwave energy. In exemplary embodiments, mechanical tuning module 406 can be either a fixed tuner or a motorized binary tuner. After mechanical tuning module 406, the tuned microwave energy is coupled to plasma applicator 410, and, specifically, into plasma discharge tube 412. In some exemplary embodiments, plasma discharge tube 412 can be made of a material such as quartz, sapphire, ceramic, or other suitable material.

In some exemplary embodiments, the profile or spatial distribution of the plasma generated in plasma discharge tube 412 is optically monitored. Accordingly, an optical sensor/detector or other light-sensitive device, such as, for example, optical sensor or optical camera 414 having a field of view 415, is positioned such that the plasma distribution in the plasma discharge tube 412 is within its field of view 415.

In an alternative embodiment, instead of optical sensor or optical camera 414, one or more thermocouples 428 (illustrated in phantom) can be positioned in proximity to or in contact with plasma discharge tube 412. Thermocouples 428 generate electrical signals indicative of their sensed temperatures. These electrical signals are transmitted to control module 424 via line(s) 430 (shown in phantom), which uses these signals to generate a spatial temperature distribution for plasma discharge tube 412. This spatial temperature distribution is used to identify "hot spots" in plasma discharge tube 412. The adjustments in frequency and/or phase to solid-state generator 402 described herein in detail can then be made as desired to move hot spots to improve lifetime expectancy of plasma discharge tube 412.

Continuing to refer to FIG. 4, solid-state generator 402, plasma applicator 410 and simplified mechanical tuning module 406 are controlled with respect to each other via a control module 424. To that end, control module 424 is connected to solid-state generator 402, simplified mechanical tuning module 406, plasma applicator 410, optical camera 414, and thermocouples 428 by cables 426, 422, 420, 416, and 430, respectively.

According to exemplary embodiments, control module 424 issues control signals to solid-state generator 402 to adjust one or more parameters of the microwave excitation energy, such as frequency, and/or phase, to control certain features of the plasma generated in plasma discharge tube 412. According to exemplary embodiments, one of the features controlled by adjustment of the parameters of the microwave excitation energy is the physical configuration of the intensity profile of the plasma. Specifically, the locations of plasma hot spots, i.e., regions of high plasma intensity, can be adjusted by control module 424 issuing control signals to solid-state generator 402 to adjust the frequency of the microwave energy, which results in changing the spatial distribution of the plasma. By thus moving plasma hot spots, lifetime expectancy of plasma discharge tube 412 is extended.

Thus, in some embodiments, the adjustment of the parameter, e.g., frequency and/or phase, is carried out in a closed-loop control fashion, based on feedback related to spatial distribution of the plasma. Referring to FIG. 4, as described above, system 400 includes an optical sensor or detector 414, which in some embodiments is an optical camera. The field of view 415 of optical sensor 414 is directed at the plasma in plasma discharge tube 412, and optical sensor 414 detects optical characteristics of the plasma and provides optical data to control module 424 via line 416. Control module 424 uses the optical data received from optical sensor 414, or electrical signals from thermocouples 428, to characterize the spatial distribution of the plasma within plasma discharge tube 412. In response to the distribution profile, control module 424 generates one or more control signals, and forwards the one or more control signals to solid-state generator 402 and/or mechanical tuning module 406 to electrically and/or mechanically tune frequency and/or phase of the microwave plasma excitation energy to change the distribution profile as desired. For example, appropriate control signals can be generated and applied to adjust frequency and/or phase to change the position of one or more plasma hot spots in plasma discharge tube 412. This movement of hot spots is used to distribute erosion of plasma discharge tube 412 by hot spots over time to extend lifetime expectancy of plasma discharge tube 412. In some exemplary embodiments, the adjustment in position can be carried out as often as is considered desirable.

Hence, according to exemplary embodiments, frequency tuning is used to control plasma formation in a plasma applicator 410 to extend the expected lifetime of plasma applicator 410. In some exemplary embodiments, an objective is to control the thermal profile by adjusting the frequency set point, which controls the plasma hot spots. In some exemplary embodiments, this can be accomplished using one of at least two possible approaches. One approach includes closed-loop control of the on-time of plasma applicator 410. Another approach includes closed-loop control of downstream applications. In this context, "downstream applications" refers to measuring the effect of the downstream radical flux of the wafer being processed. The radical flux is the atomic species that is generated in the plasma discharge tube and transported through the downstream vacuum delivery components and finally into the process chamber and onto the wafer being processed. Different gas chemistries produce different radical fluxes.

According to exemplary embodiments, there are several approaches under various scenarios for controlling the applicator plasma formation. For example, under a first scenario, using solid-state generator 402 and simplified tuner 406, the plasma in applicator 410 is ignited and maintained. Using optical sensor (camera) 414, the temperature profile in plasma discharge tube 412 in plasma applicator 410 is detected and characterized axially and azimuthally. In some exemplary embodiments, this process includes varying frequency to alter temperature to locate a plasma peak in the center of plasma discharge tube 412. This detected information is fed back to control module 424. In some exemplary embodiments, the frequency is dithered between the minimum frequency and the maximum frequency. By dithering the frequency, the "hot spots" can be moved around in plasma discharge tube 412, and thus the average temperature profile is controlled. Frequency dithering can be achieved by varying the frequency set point in non-volatile memory of control module 424 for some time.

Under a second scenario, using solid-state generator 402 and simplified tuner 406, the plasma in applicator 410 is ignited and maintained in plasma discharge tube 412. Using optical sensor (camera) 414, or, alternatively, a thermocouple, multiple thermocouples or other temperature measurement device(s), the temperature profile in plasma discharge tube 412 in plasma applicator 410 is detected and characterized axially and/or azimuthally. In some exemplary embodiments, this process includes varying frequency to alter temperature to locate a plasma peak in the center of plasma discharge tube 412. This detected information is fed back to control module 424. The product of time and temperature is integrated to hit a pre-set limit, beyond which would be detrimental to plasma discharge tube 412, and then the frequency is changed to move plasma formation in plasma discharge tube 412 to a different location in plasma applicator 410. The on-time is a control parameter that can be stored in non-volatile memory in control module 424. Based on the temperature threshold measured, warning and expected life expectancy of the plasma discharge tube 412 is provided.

Under a third scenario, using solid-state generator 402 and simplified tuner 406, the plasma in applicator 410 is ignited and maintained in plasma discharge tube 412. Using techniques such as "wafer temperature distribution map," "optical emission spectroscopy" and "spectroscopic ellipsometry," the effect of parameters such as wafer temperature distribution profile or average spatial temperature of the wafer on the downstream radical flux on the wafer being processed can be measured. The "on-time" is a control parameter that can be stored in non-volatile memory in control module 424. One or more pre-set limits based on radical dose and the resulting effects of radical dose on degradation of the plasma tube, in the form of "hot spots" or tube wear spots, can be determined empirically prior to operation and can be stored in non-volatile memory. During operation, from the parameters being measured, it is determined whether one or more preset limits is exceeded. Based on the resulting radical dose inferred from the measured parameter(s), warning and expected life expectancy of the plasma discharge tube 412 can be provided. Furthermore, remedial measures, such as adjusting frequency and/or phase of the microwave excitation energy can be taken to relocate hot spots, such that accelerated erosion of the tube is avoided, and, consequently, tube life is extended.

Figure 5A:
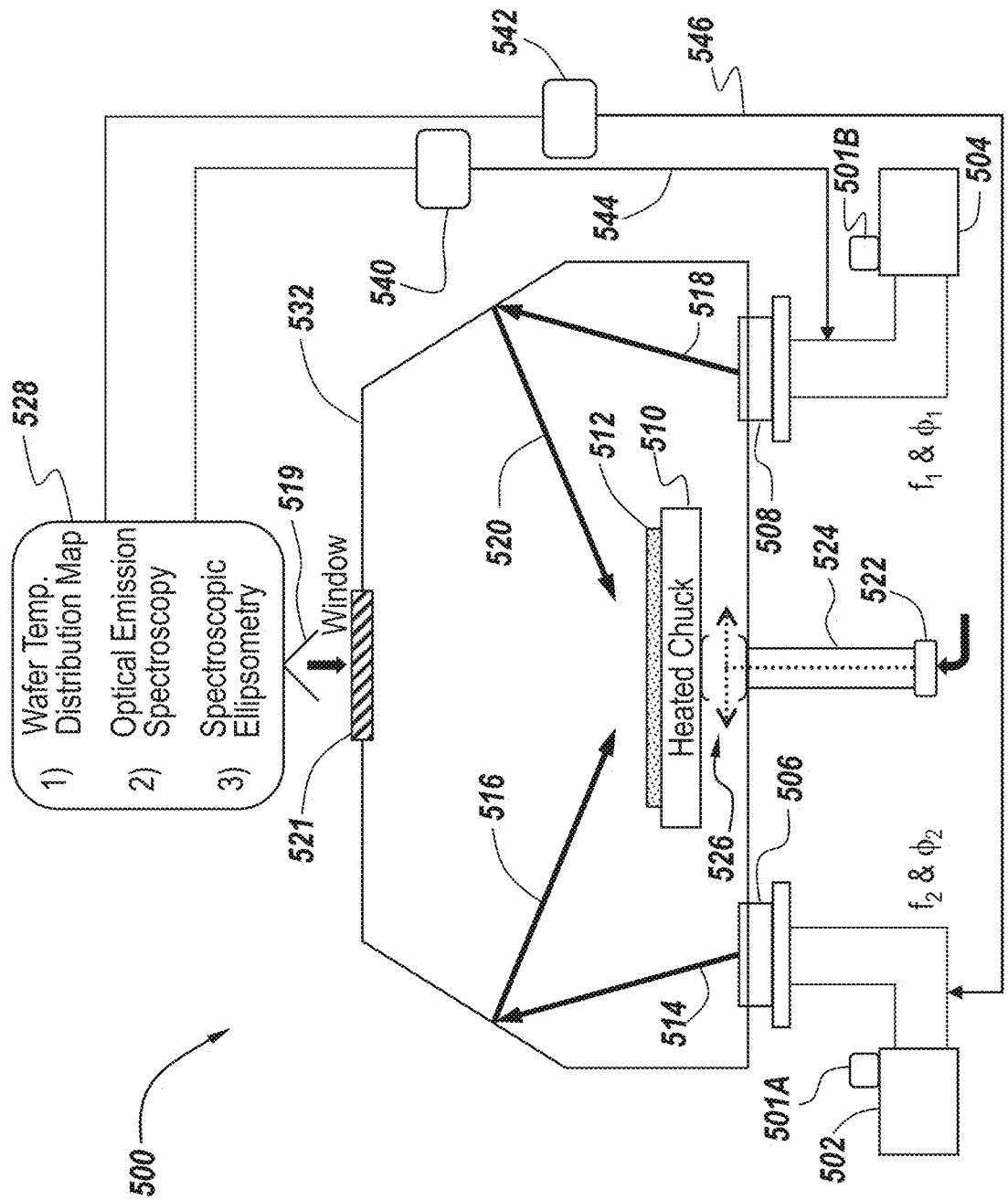
FIG. 5A includes a schematic functional block diagram of a semiconductor processing system using microwave energy generated by multiple solid-state generators, according to exemplary embodiments.

FIG. 5A includes a schematic functional block diagram of a semiconductor processing system 500 using microwave energy generated by multiple solid-state generators, according to exemplary embodiments. It will be understood that any number of microwave sources can be used. The present detailed description uses two source for purposes of clarity of illustration and description. Referring to FIG. 5A, in system 500, the microwave load (232 and 332 of systems 200 and 300 described above in detail) includes a chamber 532 in which a workpiece such as a semiconductor wafer or substrate is being processed. Microwave solid-state generators 502 and 504 generate tunable microwave energy which is coupled to chamber 532 through elements described above in connection with systems 200, 300 and 400 of FIGS. 2, 3 and 4, respectively. Solid-state generators 502 and 504 include one or more control inputs 501A and 501B, respectively, for providing a control signal, such as by a user/operator, to make adjustments to one or more parameters of the output signals from solid-state generators 502 and 504, the parameters including one or more of frequency, phase and power level of the output signals. It is noted that the phase adjustment would be made to adjust phase of one of solid-state generators, e.g., 502, with respect to the other solid-state generator, e.g., 504, according to exemplary embodiments. It is also noted that control inputs 501A and 501B are used to represent schematically optional manual adjustments provided by a user/operator. It will be understood that any control inputs provided to solid-state generators 502 and 503 can be provided by an analog signal or digital signal applied to an electrical input.

Solid-state generator 502 provides microwave energy signal $S_1$ having frequency $f_1$ and phase $\varphi 1$ to chamber 532 at microwave coupling 506, which couples the microwave energy signal $S_1$ through the wall of chamber 532 to the interior of chamber 532. Similarly, solid-state generator 504 provides microwave energy signal $S_2$ having frequency $f_2$ and phase $\varphi_2$ to chamber 532 at microwave coupling 508, which couples the microwave energy signal $S_2$ through the wall of chamber 532 to the interior of chamber 532. As described above in detail in connection with FIGS. 2, 3 and 4, frequencies $f_1$ and $f_2$ and/or phases $\varphi_1$ and $\varphi_2$ are tunable, such as by a combination of mechanical tuning and tuning of solid-state generators 502 and 504.

In exemplary embodiments, chamber 532 includes a heated wafer chuck 510, which supports and provides temperature control of wafer or substrate 512 undergoing a process such as heating. Gas flow module 522 provides one or more gases, such as plasma gases, wafer process gases and/or chamber purge gases, through gas conduit 524 through the chamber wall and to the interior of chamber 532, as indicated at 526. Microwave solid-state generators 502 and 504 provide microwave energy 514 and 518, respectively, at individually-controllable frequency f and phase cp. Microwave energy 514 and 518 is reflected by the chamber inner walls as shown. The resulting reflected microwave energy 516 and 520, respectively, include wavefronts which interfere at or near the surface of the wafer or substrate 512, thus providing the desired processing energy to the wafer or substrate 512.

Figure 5B:
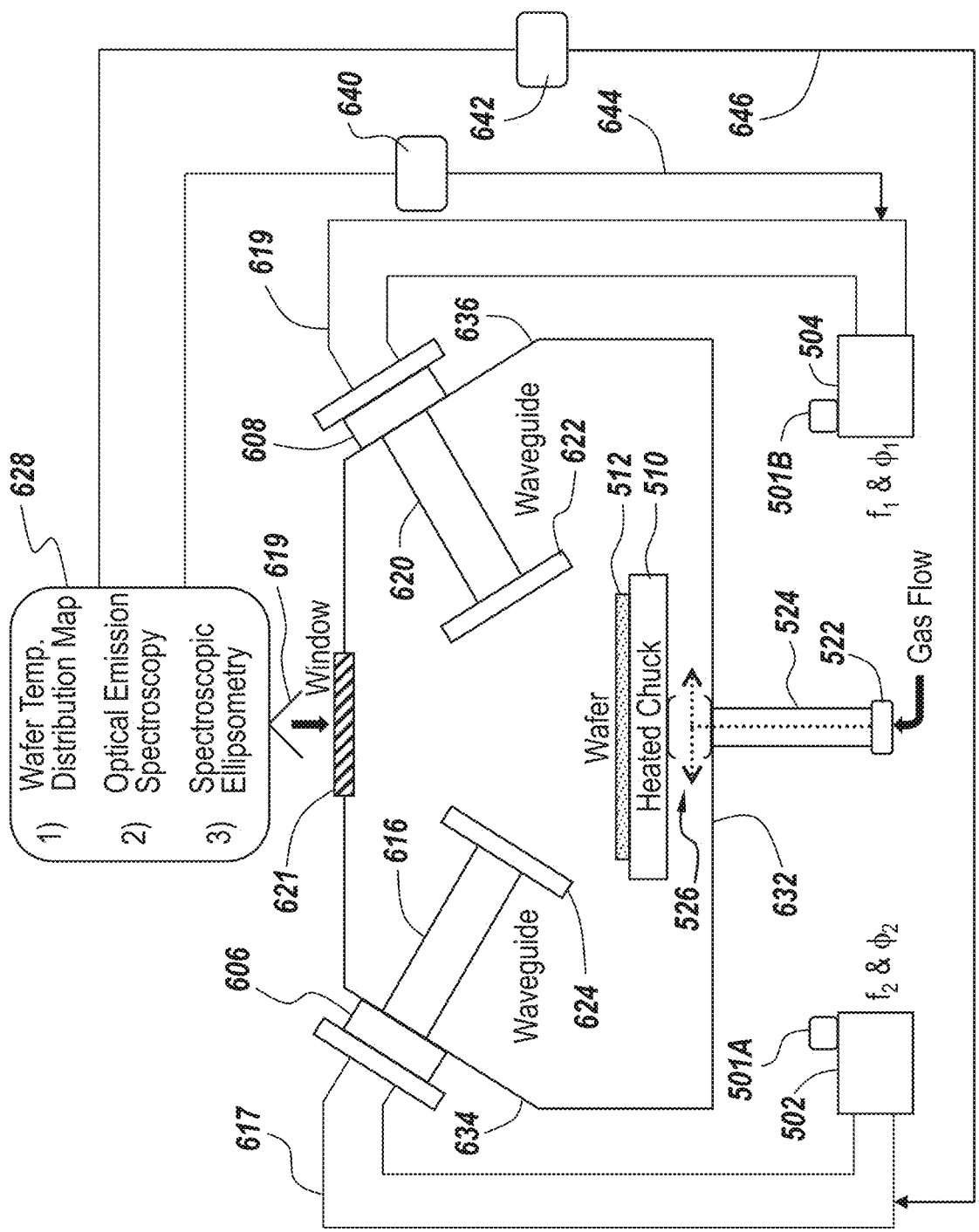
FIG. 5B includes a schematic functional block diagram of a semiconductor processing system using microwave energy generated by multiple solid-state generators, according to other exemplary embodiments.
Figure 5C:
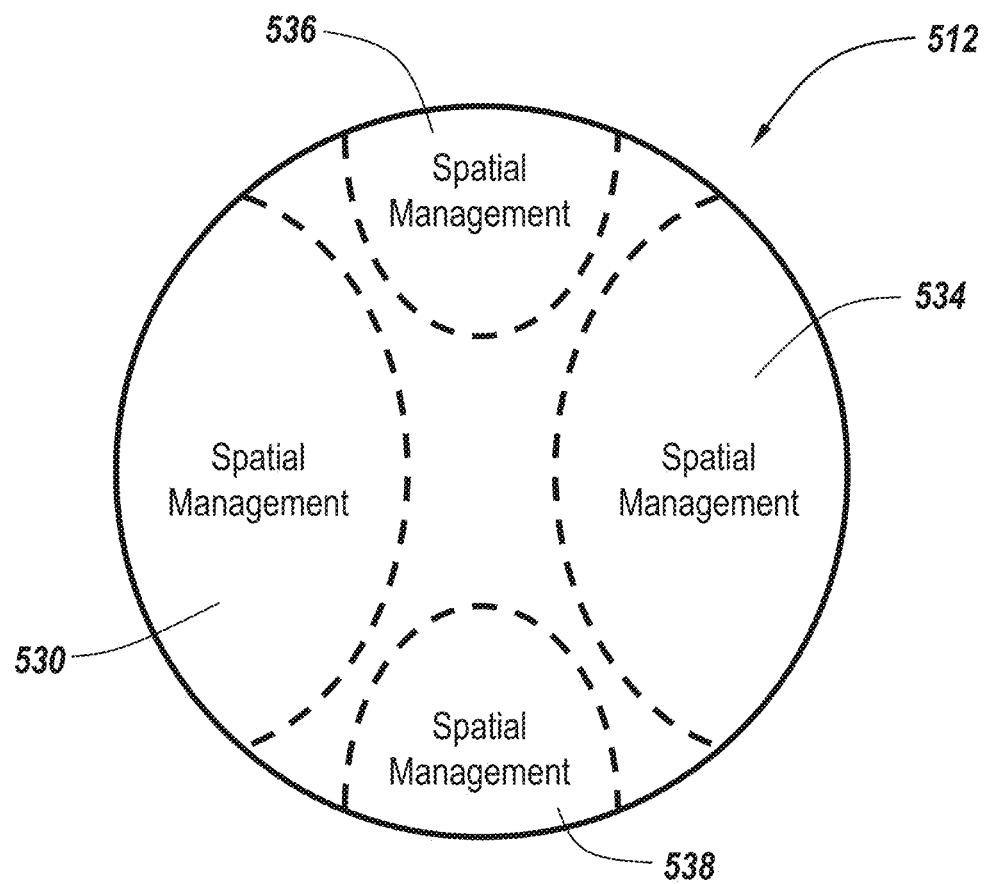
FIG. 5C includes a schematic plan view of the top surface of wafer or substrate undergoing processing, according to exemplary embodiments.

FIG. 5C includes a schematic plan view of the top surface of wafer or substrate 512 undergoing processing, according to exemplary embodiments. Referring to FIG. 5C, wafer or substrate 512 is illustrated as including multiple spatial characteristics 530, 534, 536, 538, shown as exemplary illustrations of possible spatial characteristics for purposes of illustration and detailed description. According to exemplary embodiments, variations of parameters of the microwave energy entering chamber 532, such as frequency and/or phase of the microwave energy, alters these spatial characteristics on wafer or substrate 512. According to exemplary embodiments, these parameters of the microwave energy can be adjusted or tuned by mechanical tuning, tuning of solid-state generators 502, 504, or a combination of both types of tuning, as described herein in detail in connection with exemplary embodiments.

In some exemplary embodiments, these adjustments to parameters of the microwave energy can be done manually. In other embodiments, the adjustments can be made automatically, such as by a feedback loop. To that end, diagnostic equipment 528 includes an optical sensor/detector or other light-sensitive device, such as, for example, an optical sensor or optical camera having a field of view 519, is positioned such that the surface of wafer or substrate 512 is within field of view 519 via sealed transparent window 521. Optical data indicative of the spatial temperature distribution over the surface is obtained. Diagnostic equipment 528 can thus use one or more of a wafer temperature distribution map, optical emission spectroscopy data for the wafer or substrate surface and/or spectroscopic ellipsometry via feedback control systems 542 and 540 to provide control signals via lines 546 and 544, respectively, to adjust parameters, e.g., frequency and/or phase, of the microwave energy provided by solid-state generators 502, 504, respectively, to obtain the desired spatial characteristics on the surface of wafer or substrate 512 undergoing processing.

Hence, according to exemplary embodiments, independent phase and frequency control enables spatial management. A feature of system 500 illustrated in FIG. 5A is providing independent phase and frequency control enabling spatial management over processing wafer 512. Although only two sources are illustrated for the sake of ease and simplicity of detailed description, it will be understood that any number of sources can be used. According to exemplary embodiments, there are multiple approaches under multiple possible scenarios for controlling the operation of system 500.

For example, under a first scenario, microwave solid-state generators 502 and 504 with frequency tuning capabilities are used at fixed frequency and phase but different values with respect to each other of $f_1/\varphi_1$ and $f_2/\varphi_2$, respectively, to generate energy into chamber 532. The microwaves are reflected from the chamber walls providing necessary process energy to processing wafer 512. The processing energy of both sources 502, 504 are at the same frequencies ($f_1=f_2$) but at different phases ($\varphi_1 \neq \varphi_2$). Even though the frequency of both sources are the same, a "spatial processing" takes place over wafer 512, since the phase of both sources are different, and, therefore, preferential processing occurs over wafer 512. This preferential processing can be observed using diagnostic systems such as a wafer temperature distribution map, optical emission spectroscopy and spectroscopic ellipsometry.

Under a second scenario, frequency and/or phase are controlled using feedback control. Referring to FIG. 5A, microwave solid-state generators 502 and 504 with frequency tuning capabilities are used at fixed frequency and phase but with constant change in values with respect to each other of $f_1/\varphi_1$ and $f_2/\varphi_2$, respectively, to generate energy into chamber 532. Since the processing energy signals are at different frequency and phase, spatial processing takes place over wafer 512. Therefore, preferential processing occurs. This preferential processing can be controlled and modified using a feedback control system 528 such as a wafer temperature distribution map, optical emission spectroscopy and spectroscopic ellipsometry. Control can be achieved via control system 540 and 542, which are connected to solid-state generators 504 and 502, respectively.

FIG. 5B includes a schematic functional block diagram of a semiconductor processing system 600 using microwave energy generated by multiple solid-state generators, according to exemplary embodiments. The system 600 of FIG. 5B is similar to system 500 of FIG. 5A, except that, instead of the microwave energy entering the bottom of the chamber and being reflected from the chamber walls toward wafer or substrate 512 as in system 500, in system 600 of FIG. 5B, the microwave energy is directed directly onto wafer or substrate 512 from waveguides which penetrate the walls of the chamber and are oriented such that they emit the microwave energy in the direction of wafer or substrate 512. Other than this difference, the entire detailed description above in connection with system 500 of FIG. 5A is completely applicable to system 600 of FIG. 5B.

Referring to FIG. 5B, in system 600, the microwave load (232 and 332 of systems 200 and 300 described above in detail) includes a chamber 632 in which a workpiece such as semiconductor wafer or substrate 512 is being processed. Microwave solid-state generators 502 and 504 generate tunable microwave energy which is coupled to chamber 632 through elements 617 and 619, respectively, described above in connection with systems 200, 300 and 400 of FIGS. 2, 3 and 4, respectively. Solid-state generators 502 and 504 include one or more control inputs 501A and 501B, respectively, for providing a control signal, such as by a user/operator, to make adjustments to one or more parameters of the output signals from solid-state generators 502 and 504, the parameters including one or more of frequency, phase and power level of the output signals. It is noted that the phase adjustment would be made to adjust phase of one of solid-state generators, e.g., 502, with respect to the other solid-state generator, e.g., 504, according to exemplary embodiments. It is also noted that control inputs 501A and 501B are used to represent schematically optional manual adjustments provided by a user/operator. It will be understood that any control inputs provided to solid-state generators 502 and 504 can be provided by an analog signal or digital signal applied to an electrical input.

Solid-state generator 502 provides microwave energy signal $S_1$ having frequency $f_1$ and phase $\varphi 1$ through sealed transparent window 624 via waveguide 616, which passes through sealed waveguide passage fixture 606 through wall 634 of chamber 632. Similarly, solid-state generator 504 provides microwave energy signal $S_2$ having frequency $f_2$ and phase $\varphi_2$ through sealed transparent window 622 via waveguide 620, which passes through sealed waveguide passage fixture 608 through wall 636 of chamber 632. As described above in detail in connection with FIGS. 2, 3 and 4, frequencies $f_1$ and $f_2$ and/or phases $\varphi_1$ and $\varphi_2$ are tunable, such as by a combination of mechanical tuning and tuning of solid-state generators 502 and 504. The resulting microwave energy includes wavefronts which interfere at or near the surface of wafer or substrate 512, thus providing the desired processing energy to the wafer or substrate 512.

In exemplary embodiments, chamber 532 includes a heated wafer chuck 510, which supports and provides temperature control of wafer or substrate 512 undergoing a process such as heating. Gas flow module 522 provides one or more gases, such as plasma gases, wafer process gases and/or chamber purge gases, through gas conduit 524 through the chamber wall and to the interior of chamber 532, as indicated at 526.

As noted above, the entire detailed description above in connection with system 500 of FIG. 5A is completely applicable to system 600 of FIG. 5B.

In connection with the foregoing detailed description of exemplary embodiments, one aspect of the present disclosure is the use of frequency tuning to enhance mechanical tuning, thereby providing hybrid impedance tuning, which includes mechanical tuning as well as tuning of solid-state generators. That is, a feature of the present technology is the provision of a level of impedance tuning not available with conventional magnetron operation. This additional level of impedance tuning is provided by the frequency-tuned solid-state generators of the present exemplary embodiments.

In some exemplary embodiments, operation includes three phases: a "startup phase," a "running phase," and a "shut down phase." In the startup phase, the load, e.g., plasma applicator, is ignited. Next, the dynamic impedance of the load is tuned by reducing the ratio of the reflected power to the forward power. In some exemplary embodiments, this is accomplished using the 3-stub mechanical auto tuner 230, 330, 406. As described above in detail, the movement of stub tuners 230, 330, 406 could be manual for fixed tuning of the load impedance, motorized tuning to provide remote control of stub tuners 230, 330, 406 or complete auto tuning where power detection module 210, 310 provides the amplitude of forward and reflected electric fields continuously to tune for minimum reflected power. Once the minimum ratio has been achieved, the position of the stub tuners can be maintained. In some exemplary embodiments, the frequencies of the solid-state generators are set to the center frequency of 2,450 and 915 MHz, respectively. This is an improvement over use of mechanical tuning only and, therefore, provides the hybrid tuning of the present exemplary embodiments with increased dynamic range. The running phase uses the capability of the solid-state frequency tuning to enhance the tuning. The operating frequency of the system is constantly adjusted within the range of the solid-state capability and exemplary specification of 2,400 to 2,500 MHz to tune dynamically the load impedance to minimize further the reflected power. The enhanced frequency tuning via the solid-state generator(s) is achieved in shorter time as compared to mechanical tuning. It is also known that the fixed frequency of a magnetron degrades and drifts over time and in general cannot be restored, whereas, with solid-state generator, the frequency can be reentered. This provides additional enhanced tuning. It is of particular benefit if the plasma or other related loads are frequency-sensitive. For example, if the system is initially tuned for the original magnetron frequency, as the magnetron ages and its frequency drifts, it would be difficult to tune, since the drifted frequency can no longer efficiently couple to the load. However, in a solid-state generator, the frequency will not drift, or if there is any need to readjust the frequency due to a change in the load impedance, it can be reentered in the solid-state generator.

During the running phase, it may become desirable to adjust the stub separation in stub tuners 230, 330, 406. The preset position of the stub separation is based on the preset frequency of the solid-state generator, e.g. 2,450 MHz, which also corresponds to a specific wavelength. However, as the frequency is adjusted, the waveguide wavelength is changed and therefore it may become desirable also to adjust the position. In exemplary embodiments, the three stubs can be separated by a quarter of a waveguide wavelength. This particular separation provides tuning capability over the entire Smith chart. Below is summary of waveguide wavelength for some standard waveguide sizes for center frequency of 2,450 MHz as well as the outer frequencies.

WR430 Waveguide:
$\lambda g$ at 2,400 MHz: 5.992"
$\lambda g$ at 2,450 MHz: 5.813"
$\lambda g$ at 2,500 MHz: 5.646"
WR340 Waveguide:
$\lambda g$ at 2,400 MHz: 7.118"
$\lambda g$ at 2,450 MHz: 6.823"
$\lambda g$ at 2,500 MHz: 6.667"
WR284 Waveguide:
$\lambda g$ at 2,400 MHz: 9.825"
$\lambda g$ at 2,450 MHz: 9.090"
$\lambda g$ at 2,500 MHz: 8.488"

In the shut-down phase, the frequency and stub positions are reset to default settings.

Figure 6A:
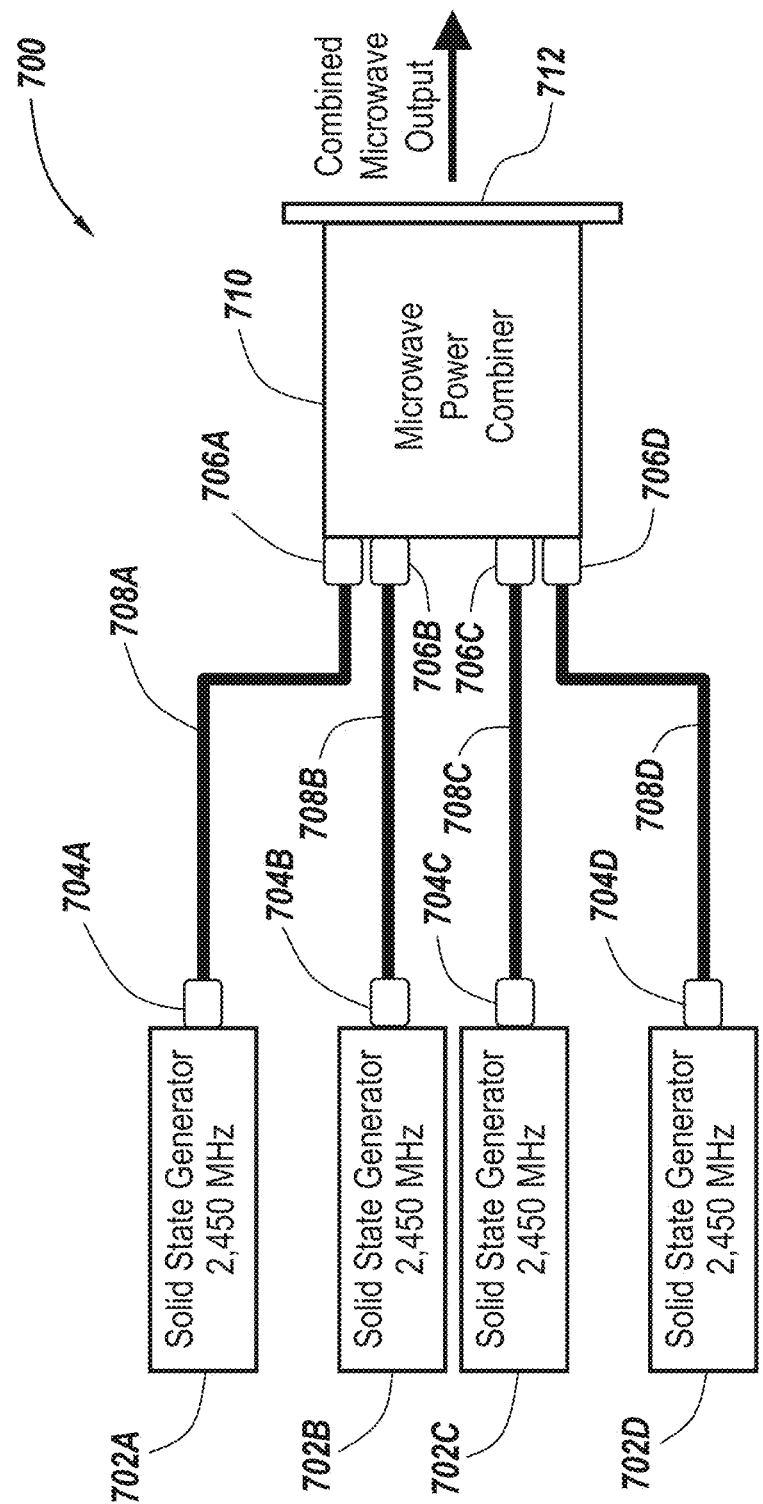
FIG. 6A includes a schematic functional block diagram of a combined solid-state generator system which can be used in place of a single solid-state generator, according to exemplary embodiments.

The detailed description of embodiments above refers to each solid-state generator as a single unit. It will be understood that any of the solid-state generators referred to herein can be implemented as multiple solid-state generators with their outputs applied to combiner circuits to combine the outputs into a single output at higher power. Also, as described herein in detail, a single solid-state generator can include multiple RF amplifiers and one or more frequency synthesizers combined into a single microwave output. This enables a higher-power microwave output that would be obtainable with a single solid-state generator. It also provides for multiple frequencies and/or phase to be combined into a single output. FIG. 6A includes a schematic functional block diagram of a combined solid-state generator system which can be used in place of a single solid-state generator, according to exemplary embodiments. Referring to FIG. 6A, solid-state generator system 700 includes a plurality of individual solid-state generators 702. In the exemplary embodiment of FIG. 6A, system 700 includes four solid-state generators 702A, 702B, 702C, 702D, each of which is illustrated to be set at a frequency of 2,450 MHz. It will be understood that the selection of the quantity (four) of solid-state generators and frequency (2,450 MHz) is only for the purpose of exemplary illustration, and that the present disclosure is applicable to multiple solid-state generators of any quantity at any frequency.

Continuing to refer to FIG. 6A, in some exemplary embodiments, solid-state generators 702A, 702B, 702C, 702D provide their output signals at output coaxial connectors 704A, 704B, 704C, 704D, respectively. The output signals are carried over coaxial cables 708A, 708B, 708C, 708D, respectively, which are connected to input coaxial connectors 706A, 706B, 706C, 706D, respectively, of microwave power combiner 710. Microwave power combiner 710 combines the received signals into a single microwave output signal, which is provided at combined microwave output 712. It should be noted that, in exemplary embodiments, combined microwave output 712 is a waveguide-compatible output. Accordingly, microwave power combiner 710 can also include coax-to-waveguide transition capability. In other exemplary embodiments, some or all of the connections among solid-state generators 702 and microwave power combiner 710 are made with waveguide instead of coaxial cables and connectors.

Figure 6B:
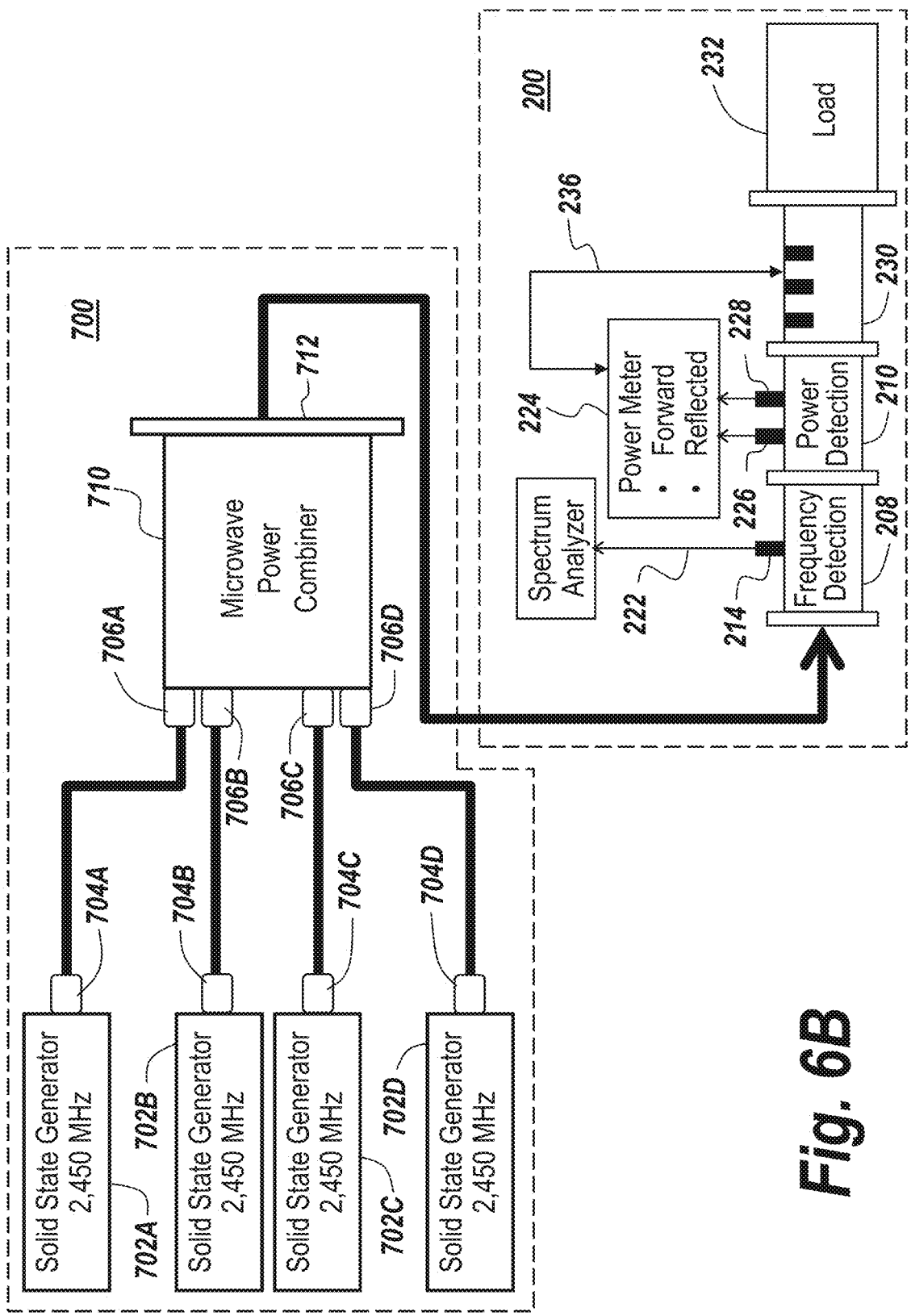
FIG. 6B includes a schematic functional block diagram of a combined solid-state generator system as illustrated in FIG. 6A, connected to a microwave system as the microwave power source, according to exemplary embodiments.

FIG. 6B includes a schematic functional block diagram of a combined solid-state generator system as illustrated in FIG. 6A, connected to a microwave system as the microwave power source, according to exemplary embodiments. Specifically, by way of exemplary illustration, FIG. 6B schematically illustrates combined solid-state generator system 700 of FIG. 6A connected to microwave system 200 illustrated in FIG. 2. It will be understood that combined solid-state generator system 700 can be used with any of the exemplary embodiments described herein. Referring to FIG. 6B, it is noted that arrow 761 is intended to illustrate schematically the waveguide connection of combined microwave output 712 to frequency detection device 208. Therefore, it will be understood that the actual physical connection, the two modules 710 and 208 would be in contact with each other at their respective waveguide flanges.

Figure 7A:
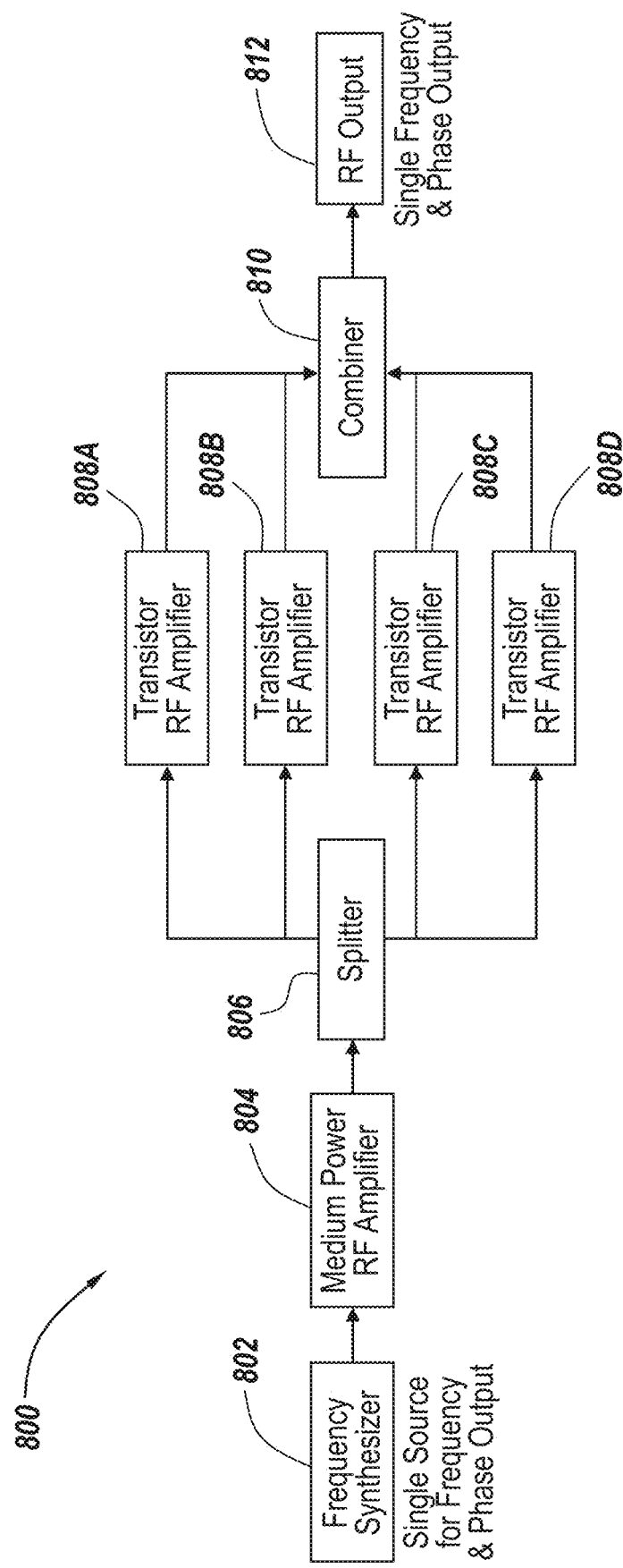
FIG. 7A includes a schematic block diagram of a solid-state generator, according to exemplary embodiments.

FIG. 7A includes a schematic block diagram of a solid-state generator 800, according to some exemplary embodiments. Solid-state generator 800 can be any of solid-state generators 202, 302, 303, 402, 502, 504, 700, 702 described herein according to the exemplary embodiments. Referring to FIG. 7A, solid-state generator 800 includes a single frequency synthesizer, which is a single source having a single-frequency and single-phase output. A medium-power RF amplifier 804 amplifies the output of frequency synthesizer 802. A splitter 806 splits the output of amplifier 804 into multiple output signals, each of which is applied to a respective transistor RF amplifier 808 for amplification. In FIG. 7A, four split output signals applied to four transistor RF amplifiers 804 are illustrated as an exemplary illustration. It will be understood that splitter 806 can generate any number of split output signals, which are applied to any number of respective transistor RF amplifiers 808. For example, if higher output power from solid-state generator 800 is desired, more than four amplifiers 808 can be used to amplify more than four respective output signals from splitter 806. The split and amplified signals are combined at combiner 810 to generate the RF output 812. Since there is only a single frequency synthesizer 802, each transistor amplifier 808 will have the same frequency and phase, such that RF output 812 will be of a single frequency and phase.

Figure 7B:
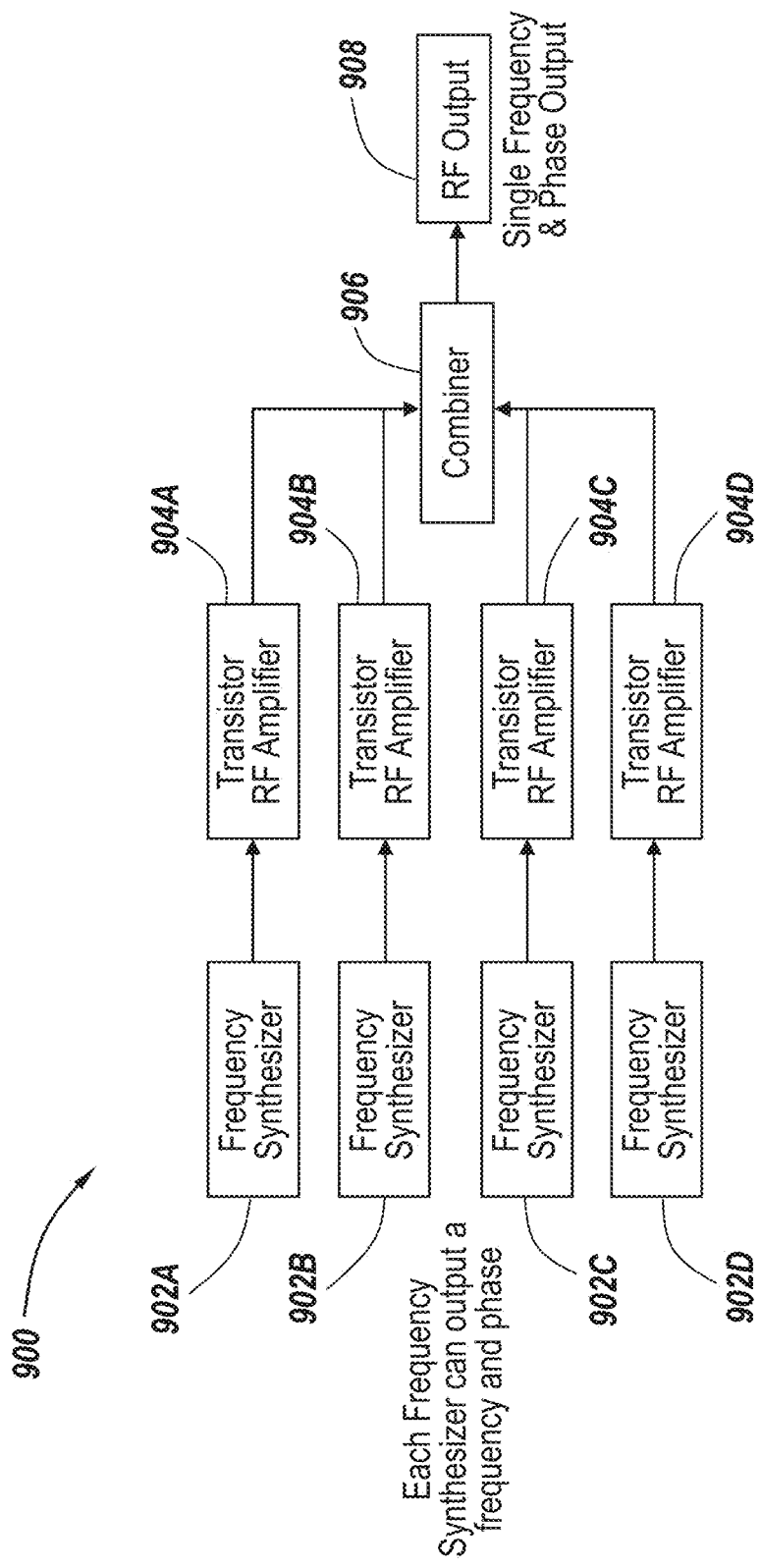
FIG. 7B includes a schematic block diagram of another solid-state generator, according to exemplary embodiments.

FIG. 7B includes a schematic block diagram of a solid-state generator 900, according to some exemplary embodiments. Solid-state generator 900 can be any of solid-state generators 202, 302, 303, 402, 502, 504, 700, 702 described herein according to the exemplary embodiments. Referring to FIG. 7B, solid-state generator 900 includes multiple frequency synthesizers 902A, 902B, 902C, 902D, each of which can output a signal of a single frequency and phase. The output of each frequency synthesizer 902A, 902B, 902C, 902D is applied to a respective transistor RF amplifier 904A, 904B, 904C, 904D for amplification. In FIG. 7B, four frequency synthesizers 902A, 902B, 902C, 902D and four transistor RF amplifiers 904A, 904B, 904C, 904D are illustrated as an exemplary illustration. It will be understood that any number of frequency synthesizers and associated transistor RF amplifiers can be used. Amplified signals from transistor RF amplifiers 904A, 904B, 904C, 904D are combined at combiner 906 to generate the RF output 908, which, as a result of the multiple frequency synthesizers 902A, 902B, 902C, 902D and multiple transistor RF amplifiers 904A, 904B, 904C, 904D, can be a multiple-frequency and multiple-phase RF output 908.

In solid-state generator 900, an independently controllable frequency synthesizer 902 is used for each transistor RF amplifier 904. This allows each transistor RF amplifier to have its own frequency and phase prior to combiner 906. This configuration allows multiple frequencies and/or phases to be combined together for a shared RF output 908. This also allows for one approach to the adjustments to frequency and/or phase of the microwave energy from solid-state generators 202, 302, 303, 402, 502, 504, 700, 702 described herein according to the exemplary embodiments.

The systems of the exemplary embodiments provide several advantages over conventional systems. For example, variable frequency capability of solid-state generators provides an enhanced tuning feature, which is not possible with conventional magnetron systems. Also, variable frequency capability of the solid-state generator allows for movement of the plasma applicator hot spot, such that adjustments can be made to extend applicator life. Independent phase and frequency control enables "spatial management" over a processing wafer either using fixed frequency of the same values or changing frequency and/or phase using a feedback control system. Variable microwave frequency and phase available with solid-state microwave generation allows a hybrid impedance tuning approach using both mechanical stub tuning and frequency tuning to respond more rapidly and reliably to impedance variations in the load, either plasma or a material to be heated.

In the foregoing detailed description of exemplary embodiments, waveguides are used for coupling the microwave energy from the solid-state generators to the load. The present disclosure is also applicable to other means for coupling the microwave energy, such as coaxial cable, microstrip, etc. It is also noted that the impedance match adjusting devices of the exemplary embodiments are described and illustrated as being mechanical stub tuners.

Other types of impedance match adjusting devices, such as an electrical network, can be used.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

The invention claimed is:

1. A microwave plasma system, comprising:
a solid-state generator for providing microwave energy characterized by one or more parameters, the solid-state generator having at least one electrical control input for receiving a control signal to vary electrically the one or more parameters of the microwave energy;
a plasma applicator for receiving the microwave energy, the plasma applicator comprising a plasma discharge tube in which a plasma is generated in response to the microwave energy, a central longitudinal axis of the plasma discharge tube extending between opposite ends of the plasma discharge tube, the plasma generated in the plasma discharge tube being characterized by a spatial plasma intensity profile distributed longitudinally along the central longitudinal axis and radially from the central longitudinal axis, perpendicular to the central longitudinal axis, toward a radial wall of the plasma discharge tube; and
a controller generating the control signal to vary electrically the one or more parameters of the microwave energy, and applying the control signal to the control input of the solid-state generator to vary electrically the one or more parameters of the microwave energy to alter the spatial plasma intensity profile in the plasma discharge tube; wherein
the solid-state generator comprises: (i) a plurality of microwave amplifiers with independently controllable frequency, phase, and/or amplitude, each of the microwave amplifiers generating one of a respective plurality of amplified microwave signals and (ii) a microwave combiner receiving the plurality of amplified microwave signals and combining the plurality of amplified microwave signals into a single combined microwave signal and applying the single combined microwave signal as the microwave energy to the plasma applicator.

2. The microwave plasma system of claim 1, further comprising:
a waveguide for coupling the microwave energy to the plasma discharge tube;
a mechanical tuner coupled to the waveguide to vary mechanically at least one of the one or more parameters of the microwave energy.

3. The microwave plasma system of claim 2, wherein the mechanical tuner comprises a microwave stub tuner.

4. The microwave plasma system of claim 3, wherein the microwave stub tuner comprises multiple stubs.

5. The microwave plasma system of claim 2, wherein the mechanical tuner is a fixed tuner.

6. The microwave plasma system of claim 2, wherein the mechanical tuner is a motorized binary tuner.

7. The microwave plasma system of claim 1, wherein the one or more parameters of the microwave energy comprise frequency of the microwave energy.

8. The microwave plasma system of claim 1, wherein the one or more parameters of the microwave energy comprise phase of the microwave energy.

9. The microwave plasma system of claim 1, wherein the solid-state generator comprises a plurality of frequency synthesizers with independently controllable frequency and/or phase, outputs of the plurality of frequency synthesizers being used to generate the microwave energy.

10. The microwave plasma system of claim 1, wherein the solid-state generator comprises plurality of amplifiers with independently controllable frequency and/or phase, outputs of the plurality of amplifiers being used to generate the microwave energy.

* * * * *